US011300606B2

(12) United States Patent
Cordier

(10) Patent No.: US 11,300,606 B2
(45) Date of Patent: Apr. 12, 2022

(54) METHOD AND DEVICE FOR ON-BOARD DETECTION OF POTENTIAL FAULTS IN A SYSTEM FIXED ONTO THE BOARD

(71) Applicant: STMicroelectronics (Rousset) SAS, Rousset (FR)

(72) Inventor: Nicolas Cordier, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 44 days.

(21) Appl. No.: 16/794,977

(22) Filed: Feb. 19, 2020

(65) Prior Publication Data
US 2020/0271716 A1    Aug. 27, 2020

(30) Foreign Application Priority Data
Feb. 22, 2019   (FR) ....................................... 1901809

(51) Int. Cl.
*G01R 31/28*    (2006.01)

(52) U.S. Cl.
CPC ................................ *G01R 31/2818* (2013.01)

(58) Field of Classification Search
CPC .............. G01R 31/2818; G01R 31/50; G01R 31/2822; G01R 31/2843; G01R 31/281
See application file for complete search history.

(56) References Cited

U.S. PATENT DOCUMENTS

| 7,856,328 | B2* | 12/2010 | Barsoukov | G01R 31/389 |
| | | | | 702/63 |
| 2014/0179239 | A1* | 6/2014 | Nickel | H04B 17/12 |
| | | | | 455/67.14 |
| 2015/0045635 | A1* | 2/2015 | Tankiewicz | A61B 5/0004 |
| | | | | 600/309 |
| 2016/0308587 | A1* | 10/2016 | Lee | H04B 5/0081 |

FOREIGN PATENT DOCUMENTS

| DE | 102013110017 A1 | 3/2015 |
| EP | 2570818 A1 | 3/2013 |
| EP | 2806586 A1 | 11/2014 |
| KR | 1020160088152 A | 7/2016 |

OTHER PUBLICATIONS

INPI Search Report and Written Opinion for FR1901809 dated Nov. 27, 2019 (10 pages).
Rohrl Franz Xaver et al: "Differential Wideband Interconnects for Organic Millimeter Wave Chip Packages: An Effort to Design an All-Purpose RF Chip Package," 2016 11th European Microwave Integrated Circuits Conference (EUMIC), Oct. 3, 2016, pp. 536-539.

* cited by examiner

*Primary Examiner* — Akm Zakaria
(74) *Attorney, Agent, or Firm* — Crowe & Dunlevy

(57) ABSTRACT

An electronic assembly includes a board and a system mounted to the board. The system includes an impedance matching circuit coupled to a contactless component. A detection circuit operates to carrying out a process for detecting on the board of potential faults in the system (Continued)

mounted to the board. The detection circuit includes a circuit incorporated into the contactless component itself and configured to carrying out a first part of the process for detecting. A processing circuit of the detection circuit performs a second part of the process for detecting based on results of the first part.

15 Claims, 6 Drawing Sheets

METHOD AND DEVICE FOR ON-BOARD DETECTION OF POTENTIAL FAULTS IN A SYSTEM FIXED ONTO THE BOARD

PRIORITY CLAIM

This application claims the priority benefit of French Application for Patent No. 1901809, filed on Feb. 22, 2019, the content of which is hereby incorporated by reference in its entirety to the maximum extent allowable by law.

TECHNICAL FIELD

Embodiments relate to the detection of potential faults in the assembly of an on-board system, the board being, for example, a printed circuit board comprising tracks and being designed to receive components that are, for example, soldered onto the board.

The embodiments are notably applicable, but not exclusively so, to a system comprising a contactless component coupled to an impedance matching circuit.

BACKGROUND

Contactless communications use electronic components connected to an antenna and configured for exchanging information with an external device via the antenna according to a communications protocol of the contactless type.

A contactless component is a component capable of exchanging information through an antenna with another contactless device according to a communications protocol of the contactless type.

Such contactless components may, for example, be components referred to as "NFC components", in other words components compatible with the near-field communications technology (or NFC technology).

The NFC component may, for example, be an NFC microcontroller.

The acronym NFC ("Near Field Communication") denotes a high-frequency, short-range, wireless communications technology, which allows contactless exchanges of data between two devices over a short distance, for example 10 cm.

NFC technology is standardized in the documents ISO/IEC 18 092 and ISO/IEC 21 481, but incorporates a variety of pre-existing standards including the type A and type B protocols of the standard ISO/IEC 14 443.

An NFC microcontroller can generally be used either in "reader" mode or in "card" mode for communicating with another contactless device, for example using a contactless communications protocol such as the type A protocol of the standard ISO/IEC 14 443.

In "reader" mode, the NFC component acts as a reader with respect to the contactless external device which may then be a card or else a tag. In reader mode, the NFC component can then read the content of the external device and write information into the external device.

In "card" mode, the NFC component then behaves as a card or a tag and communicates with the external device which is now a reader.

An NFC microcontroller may, for example, be incorporated into a cellular mobile telephone, and the latter may then be used, aside from its function as a conventional telephone, for exchanging information with the external contactless device.

Numerous applications are thus possible, such as passage through a toll barrier in the transport sector (the mobile telephone acts as a transport ticket) or else payment applications (the mobile telephone acts as a credit card).

Contactless components, such NFC components, are generally connected to the antenna via an impedance matching circuit with the aim of optimizing radiofrequency communications. These external components used in this impedance matching circuit, for example coils and capacitors, are then dimensioned in such a manner as to allow a good frequency matching of the antenna, for example on a carrier frequency (for example 13.56 MHz), and thus to ensure the optimum performance.

Generally speaking, the impedance matching circuit incorporates a filter designed to filter electromagnetic interference and is commonly denoted by those skilled in the art under the acronym EMI (ElectroMagnetic Interference) filter. More precisely, this EMI filter, which is generally an inductive-capacitive filter (LC filter), reduces emission of high harmonics of the transmission signal, typically at 13.56 MHz, as far as possible.

The assembly on an electronic board of a contactless component, in particular an NFC microcontroller, and of the impedance matching circuit, is complex. It generally requires six pins, plus pins dedicated to ground, plus a dozen inductive, resistive, capacitive discrete components, and two antenna connections.

The majority of the faults detected during the production tests of the devices are due to the process of assembly onto the printed circuit board.

It is preferable to detect these faults sufficiently early in the production line, for example during the test of the electronic board.

The conventional solutions include a test of each node of the impedance matching circuit, which necessitates test points and a network analyzer for example, and also while placing the integrated circuit in various modes.

The radiofrequency emission signals may also be delivered to the integrated circuit and the current consumption measured with an external ampmeter and all the nodes of the impedance matching circuit tested by virtue of the test points with an external oscilloscope.

Furthermore, the JTAG (Joint Test Action Group) test chains, well known to those skilled in the art, do not allow the connections of the radiofrequency interfaces to be tested.

Furthermore, the test points occupy space on the printed circuit board and are not accessible when the integrated circuit is covered by a shield such that it is necessary to provide additional tracks.

Furthermore, the measurement equipment leads to an extra cost in terms of both price and in terms of test time.

There accordingly exists a need to provide a detection of potential on-board faults of a system fixed onto the board, comprising for example a contactless component, such as an NFC microcontroller, connected to an impedance matching circuit, which overcomes the aforementioned drawbacks and which offers, in particular, a detection that is simple and easy to implement and which can be carried out sufficiently early in the production, for example during the test of the printed circuit board, but also potentially at a later stage or even directly in an apparatus incorporating the system, for example a cellular mobile telephone, in particular during a customer return following an observed fault.

SUMMARY

According to one embodiment and its implementation, an onboard self-test is provided which uses the contactless component itself, and which allows the diagnosis of potential faults to be carried out in the assemblage of the system fixed onto the board.

According to one aspect, a method for on-board detection of potential faults in a system fixed onto the board is provided, the system comprising an impedance matching circuit coupled to a contactless component, for example an NFC microcontroller, wherein a first part of detecting fault is carried out by the contactless component itself.

In other words, the contactless component itself is used to carry out at least the first part of the detection, typically measurements of levels of physical quantities such as currents and voltages, so as to obviate the need for test points and measurement equipment.

According to one embodiment, the potential faults belong to the group comprising potential faults in the components of the impedance matching circuit, potential faults in the connections of these components onto the board, and potential faults in the connections of the contactless component onto the board.

During the first part, it is desirable to couple the impedance matching circuit to an antenna. This also allows potential faults in the coupling points with the antenna to be taken into account.

By way of example, a potential fault may comprise a fault of the short-circuit type or a fault of the open-circuit type.

In other words, a short-circuited component of the impedance circuit or else a defective component which results in an open-circuit may thus, for example, be detected.

Similarly, in a pin or at a solder point a fault in this solder joint may be detected which results in an open-circuit or else in a short-circuit with another conducting element.

The antenna, which is advantageously coupled to the impedance matching circuit during the first part, may be a device emulating the antenna, for example an inductive-resistive circuit or else the real antenna which will be implemented within an apparatus configured to contain the board. This may be useful in particular when the method is implemented within the apparatus itself, for example the telephone, when it is returned by a customer due to a malfunction.

According to one embodiment, a second part of detecting fault comprises analyzing results coming from the first part in order to diagnose the potential faults.

This second part may also be carried out within the contactless component.

As a variant, it could be carried out within a processing unit, for example a microprocessor, fixed onto the board but distinct from the contactless component. It would also be possible for this second part to be carried out within a processing unit not carried by the board, for example within a processing unit of a test bench.

According to one embodiment, the first part comprises the delivery by the contactless component of test signals in the impedance matching circuit and the results then comprise levels of physical quantities resulting from the delivery of test signals, the levels being determined by the contactless component.

Here again, the use of external measurement means is avoided.

Then, the second part will analyze these levels of physical quantities with respect to reference levels.

For this purpose, the second part advantageously comprises the execution of a software application implementing at least one decision tree.

Advantageously, the delivery by the contactless component of the test signals in the first part comprises delivery in differential modes and/or using a single-ended input/output ("single ended" according to a terminology well known to those skilled in the art).

More precisely, according to one embodiment, the contactless component comprises two output terminals and two input terminals connected to the impedance matching circuit and intended for the delivery and for the receipt of contactless communications signals, for example radiofrequency signals.

The first part then comprises: a first delivery on the two output terminals of two first test signals in phase opposition and a receipt of two corresponding first signals on the two input terminals.

Here, this corresponds to a delivery in differential mode.

The result determined by these deliveries then comprises the differential level of the current flowing in the impedance matching circuit, together with the differential amplitude of the corresponding two first signals received and/or the phase of one of the corresponding two first signals received.

Generally speaking, the phase of a received signal is the phase-shift of this received signal with respect to the corresponding transmitted signal (or the difference of phase between this received signal and the corresponding transmitted signal). This transmitted signal is for example timed by the local oscillator at the carrier frequency, for example 13.56 MHz.

In this differential mode, since the phase difference between the two first signals received is 180°, it suffices to determine the phase of only one of the two first signals received.

The first part also comprises a second delivery on a first output terminal of a second test signal and a receipt of a corresponding second signal on a first input terminal. Here, this therefore corresponds to a single-ended input/output mode.

The result determined by this second delivery then comprises the amplitude and/or the phase of the corresponding second signal received.

The first part also comprises a third delivery on a second output terminal of a third test signal and a receipt on a second input terminal of a corresponding third signal.

Here again, this corresponds to a single-ended input/output mode but this time on the other output terminal and the other input terminal.

The result determined by this third delivery comprises the amplitude and/or the phase of the corresponding third signal received.

Although the terms "first", "second", "third", have been assigned to the word "delivery", this does not imply a particular order in which these deliveries are made.

In fact, this has no importance and, for example, the two deliveries may be carried out in single-ended input/output mode prior to the delivery of the test signals in differential mode or vice versa, or else place the delivery in differential mode between the two deliveries in single-ended input/output mode.

In fact, this first part aims to obtain the levels of the various physical quantities. These levels could then be, for example, stored and analyzed later on in the second part.

Accordingly, the at least one decision tree used in the second part comprises for example three decision levels.

The second part then comprises, according to one embodiment, a first step comprising: at the first decision level, a first comparison between the differential level of current and at least one differential reference level, then, at the second decision level, second comparisons between the differential amplitude and/or the phase and reference differential amplitudes and/or reference phases, then, at the third decision level, a determination of the difference between the amplitude and/or the phase of the corresponding second signal received and the amplitude and/or the phase of the corresponding third signal received and third comparisons between this difference of amplitude and/or of phase and reference differences of amplitude and/or phase.

Depending on the results of these comparisons, the decision trees will therefore be scrutinized so as to arrive at a diagnosis leading to the detection and to the identification of certain faults or else to a diagnosis concluding, at this stage, the absence of faults.

However, certain types of faults may not be able to be diagnosed during this first step.

This is particularly the case when the contactless component comprises two additional output terminals connected to the impedance matching circuit and designed to connect the impedance matching circuit to one or more damping resistors.

In this case, if the first step of the second part does not reveal any detectable fault, the second part may comprise a second step configured to detect potential faults of the short-circuit type in these additional output terminals.

More precisely, for this purpose, a re-execution of the first part is advantageously provided after having configured the two additional output terminals in high impedance mode and the second step then comprises, for example, additional comparisons respectively between the differential level of the current, the differential amplitude and/or the phase, the difference of amplitude and/or of phase and at least one additional reference differential level, at least one additional reference differential amplitude and/or at least one additional reference phase, at least one additional reference difference of amplitude and/or at least one additional reference difference of phase.

The various reference levels and/or the various additional reference levels may, for example, have been generated during a preliminary part, for example by simulation and/or intentional creation of faults in the impedance matching circuit.

As indicated hereinbefore, the contactless component may be an NFC microcontroller.

Furthermore, as indicated hereinbefore, the method may be implemented prior to insertion of the board into an apparatus designed to support a contactless communications function, for example a cellular mobile telephone or a tablet, without these examples being limiting.

As a variant, the method may be implemented within an apparatus designed to support a contactless communications function and equipped with the board. This may be useful, as indicated hereinbefore, for an implementation of the detection of potential faults if and when the customer sends the apparatus back.

According to another aspect, an electronics assembly is provided, comprising a board, a system fixed onto the board and comprising an impedance matching circuit coupled to a contactless component, and a detection device configured for performing a detection on the board of potential faults in the system fixed onto the board, the detection device comprising a first circuit incorporated into the contactless component itself and configured for carrying out a first part of the detection.

According to one embodiment, the potential faults belong to the group comprising potential faults in the components of the impedance matching circuit, potential faults in the connections of these components onto the board, potential faults in the connections of the contactless component onto the board.

According to one embodiment, the impedance matching circuit is configured to be coupled to an antenna during the first part.

According to one embodiment, the group furthermore comprises potential faults at the coupling points with the antenna.

According to one embodiment, a potential fault comprises a fault of the short-circuit type or of the open-circuit type.

Thus, for example, for a component, a fault of the short-circuit type results in an electrical link between its terminals. For a terminal, a fault of the short-circuit type results, for example, in a link of this terminal with the ground of the circuit.

For a component, a fault of the open-circuit type results, for example, in a malfunction of the component and for a terminal such a fault results, for example, in the non-passage of a signal through this terminal.

According to one embodiment, the first circuit is configured for delivering results at the end of the first part, and the detection device furthermore comprises an analysis circuit configured for, during a second part of the detection, analyzing the results in order to diagnose the potential faults.

According to one embodiment, the analysis circuit is incorporated within the contactless component, or else within a processing unit, fixed onto the board but distinct from the contactless component, or else within a processing unit not carried by the board.

According to one embodiment, the first circuit comprises a delivery circuit configured for delivering test signals into the impedance matching circuit and the results comprise levels of physical quantities resulting from this delivery of test signals, the first circuit comprising a determination circuit configured for determining the levels.

According to one embodiment, the analysis circuit is configured for analyzing the levels of physical quantities with respect to reference levels.

According to one embodiment, the analysis circuit is configured for executing a software application implementing at least one decision tree.

According to one embodiment, the delivery circuit is configured for delivering the test signals in differential modes and/or using a single-ended input/output.

According to one embodiment, the contactless component comprises two output terminals and two input terminals connected to the impedance matching circuit and configured for the delivery and the receipt of contactless communications signals, and the delivery circuit is are configured for: carrying out a first delivery on the two output terminals of two first test signals in phase opposition and receiving two corresponding first signals on the two input terminals, and the determination circuit is configured for determining the differential level of the current flowing in the impedance matching circuit, together with the differential amplitude of the corresponding two first signals received and/or the phase of one of these corresponding two first signals received, carrying out a second delivery on a first output terminal of a second test signal and receipt of a corresponding second signal on a first input terminal, and the determination circuit is configured for determining the amplitude and/or the phase of the corresponding second signal received, carrying out a third delivery on a second output terminal of a third test signal and receiving a corresponding third signal on a second input terminal, and the determination circuit is configured for determining the amplitude and/or the phase of the corresponding third signal received.

According to one embodiment, the at least one tree comprises three decision levels and the analysis circuit is configured for carrying out a first step comprising: at the first decision level, a first comparison between the differential level of the current and at least one differential reference level, then at the second decision level, second comparisons between the differential amplitude and/or the phase and reference differential amplitudes and/or reference phases, then at the third decision level, a determination of the difference between the amplitude and/or the phase of the corresponding second signal received and the amplitude and/or the phase of the corresponding third signal received and third comparison between this difference of amplitude and/or of phase and reference differences of amplitudes and/or reference difference of phase.

According to one embodiment, the contactless component comprises two additional output terminals connected to the impedance matching circuit and designed to connect the impedance matching circuit to one or more damping resistors and, if the first step of the second part does not reveal any detectable fault, the analysis circuit is configured for carrying out a second step configured to detect potential faults of the short-circuit type in the additional output terminals.

According to one embodiment, the two additional output terminals are configured in high impedance mode, the first circuit is configured for performing a re-execution of the first part, and the analysis circuit is configured for carrying out, during the second step, additional comparisons respectively between the differential level of the current, the differential amplitude and/or the phase, the difference of amplitude and/or of phase and at least one additional reference differential level, at least one additional reference differential amplitude and/or at least one additional reference phase, at least one difference of amplitude and/or of additional reference phase.

According to one embodiment, the electronics assembly comprises a memory designed to store the reference levels and/or the additional reference levels.

According to one embodiment, the contactless component is an NFC controller.

According to another aspect, a contactless component belonging to the electronics assembly such as defined hereinbefore is provided.

According to one embodiment, this contactless component comprises the first circuit configured for implementing at least the first part of the detection method such as defined hereinbefore.

According to another aspect, an apparatus is provided, for example a cellular mobile telephone or a tablet, designed to support a contactless communications function and incorporating an electronics assembly such as defined hereinbefore.

BRIEF DESCRIPTION OF THE DRAWINGS

Other advantages and features of the invention will become apparent upon examining the detailed description of embodiments and of their implementation, which are in no way limiting, and from the appended drawings in which.

DETAILED DESCRIPTION

Figure 1:
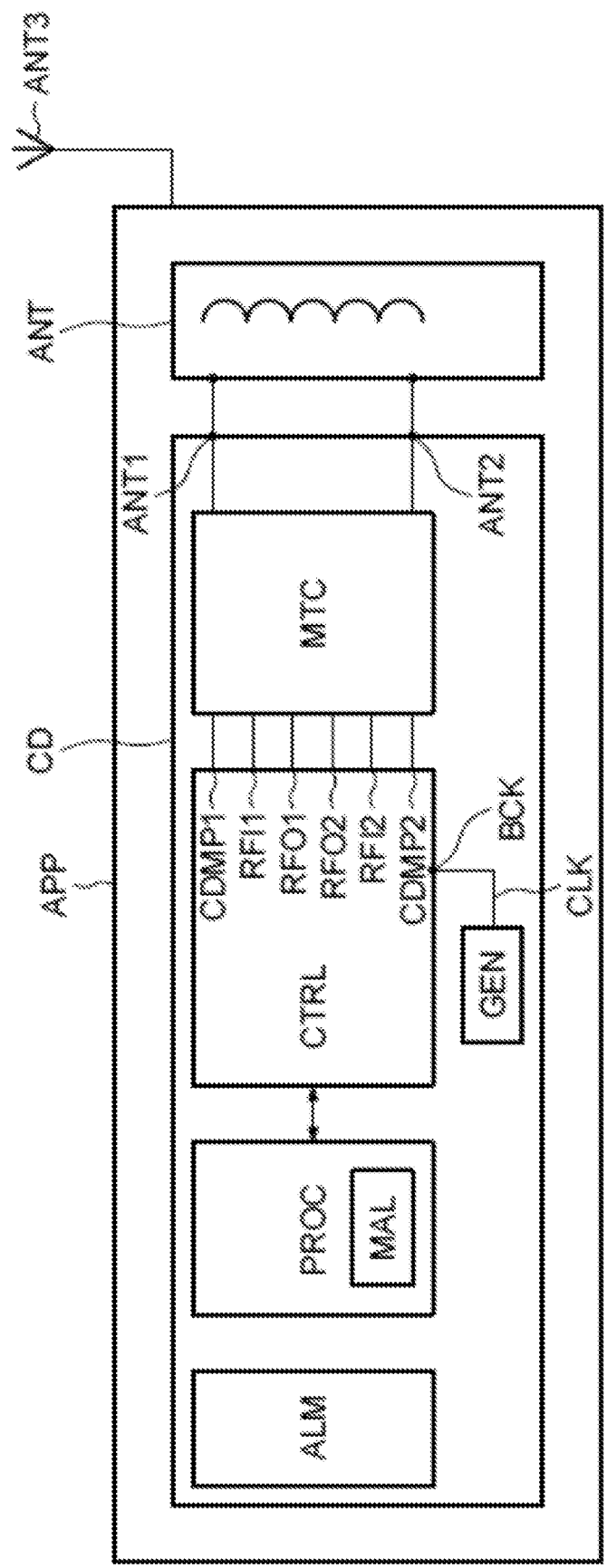
FIG. 1 illustrates a block diagram of a communications apparatus.

In FIG. 1, the reference APP denotes a communications apparatus, for example a cellular mobile telephone, in particular of the "smartphone" type, or a tablet, equipped with an antenna ANT3 for the establishment of telephone communications.

In the present case, the apparatus also comprises an NFC system comprising a contactless component CTLR, for example an NFC microcontroller, connected to an impedance matching circuit MTC.

This system with the microcontroller CTLR-impedance matching circuit MTC is fixed in a conventional manner known per se, for example by bead solder joints, onto a printed circuit board CD.

Here, the board CD further carries a microprocessor PROC coupled to the microcontroller CTLR.

The board CD also comprises a power supply module ALM designed to power the board, together with a generator GEN that provides a clock signal CLK to a terminal or pin BCK of the microcontroller CTLR.

Aside from this pin BCK, the microcontroller CTLR notably comprises six other terminals or pins CDMP1, RFI1, RFO1, RFO2, RFI2 and CDMP2 whose functions will be described in more detail hereinafter.

These pins are connected to the impedance matching circuit MTC.

Furthermore, an NFC antenna, referenced ANT, is also coupled to the impedance matching circuit MTC via two connection points ANT1, ANT2.

In the example described here, the antenna ANT is the NFC antenna effectively present in the apparatus APP. It may be connected to the board CD by means of specific connections (for example connections known by those skilled in the art under the terminology of "Pogo pin").

In order to carry out the detection of potential faults in the system CTLR-MTC fixed onto the board CD, it is possible, as shown in FIG. 1, to couple the antenna ANT effectively present in the telephone on the board CD and to carry out this detection of faults within the telephone itself.

As a variant, it is possible to detect potential faults in the system CTLR-MTC installed on the board CD before inserting the board CD into the apparatus APP. In this case, a circuit emulating the characteristics of the future antenna could then advantageously be connected onto the two terminals ANT1, ANT2. This circuit emulating the antenna may, for example, be a resistive inductive capacitive (RLC) circuit.

Figure 2:
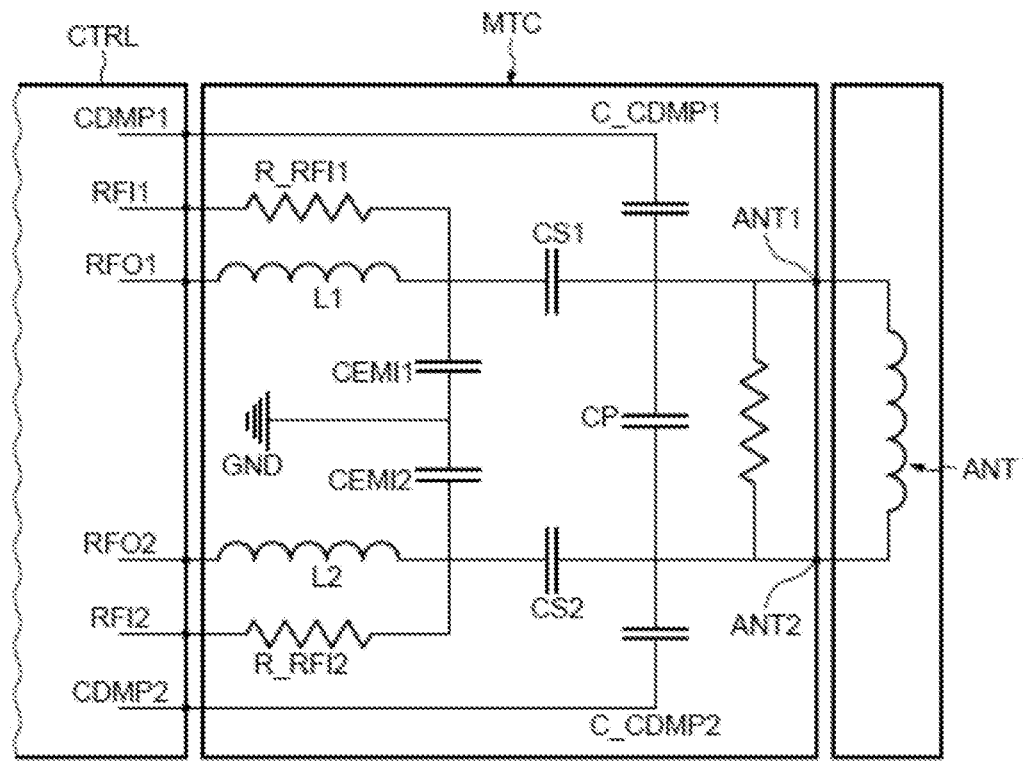
FIG. 2 illustrates circuit details for an impedance matching circuit.

As illustrated in FIG. 2, in the example described, the microcontroller CTLR has two output terminals RFO1, RFO2 usable in reader mode or for the generation of the active or passive load modulation in card mode and two other terminals RFI1 and RFI2 usable in reader mode and in card mode.

For this purpose, the microcontroller CTRL may be equipped with an internal switch allowing the terminals RFO1 and RFO2 to be short-circuited for an operation in card mode or these terminals RFO1 and RFO2 not to be short-circuited in order to allow an operation in reader mode or during the generation of the active or passive load modulation in card mode.

The external impedance matching circuit MTC is connected between the two coupling points ANT1, ANT2 and the various terminals RFI1, RFO1, RFO2, RFI2, together with the additional terminals CDMP1 and CDMP2.

The structure of such an impedance matching circuit MTC is conventional and known per se.

This impedance matching circuit here comprises a filter designed to filter electromagnetic interference (EMI filter).

This filter is conventionally a filter of the LC type here comprising a coil L1 connected in series between the terminal RFO1 and ground GND with a capacitor CEMI1.

The filter EMI also comprises a coil L2 connected in series between the terminal RFO2 and ground with a capacitor CEMI2.

The impedance matching circuit MTC further comprises two capacitors CS1, CS2 connected in series respectively between the coils L1 and L2 and the coupling points ANT1 and ANT2.

These capacitors are chosen in order to maximize the current in the antenna so as to increase the amplitude of the electromagnetic field.

The impedance matching circuit MTC also comprises two resistors R_RFI1 and R_RFI2 respectively connected between the terminals RFI1 and RFI2 and the nodes common to the coils L1 and L2 and to the capacitors CS1 and CS2.

Two other capacitors C_CDMP1 and C_CDMP2 are respectively connected between the additional output terminals CDMP1 and CDMP2 and the coupling points ANT1 and ANT2.

Another capacitor CP, of lower capacitive value, is connected in parallel with the terminals of the antenna ANT. Similarly, a resistor RP is connected in parallel between the two coupling points ANT1 and ANT2.

The additional output terminals CDMP1 and CDMP2 allow the impedance matching circuit MTC to be connected to resistors referred to as damping resistors, so as to provide damping for the resonant circuit that the component CMP forms with the antenna ANT1 and the external impedance matching circuit MTC in the card mode.

Figure 3:
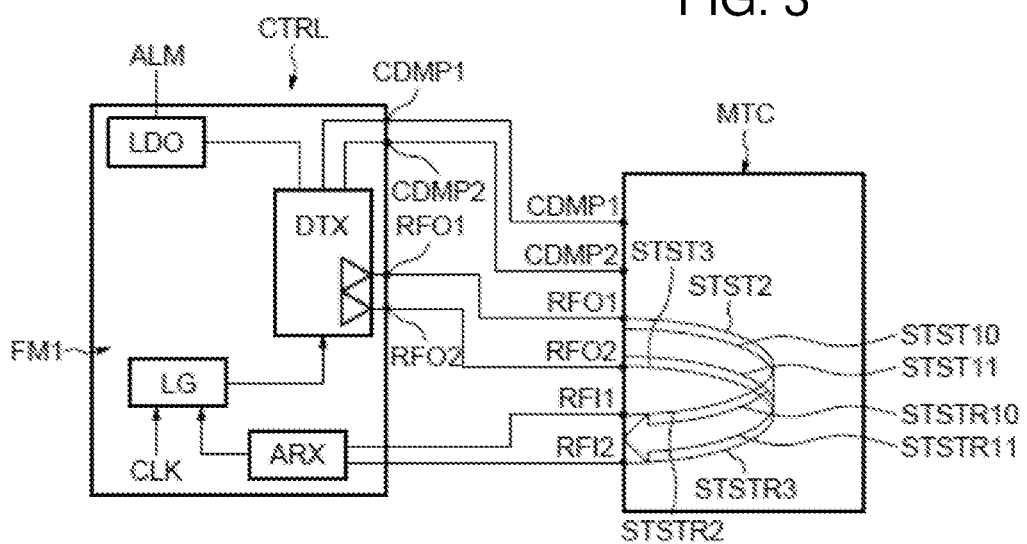
FIG. 3 illustrates a circuit for carrying out a first part of the detection of potential faults.

With reference more particularly to FIG. 3, it can be seen that the microcontroller CTLR comprises a first circuit FM1 configured for carrying out a first part of the detection of potential faults.

This first part here comprises the obtaining of measured levels of physical quantities that will be detailed hereinafter.

The first circuit FM1 here comprises a control logic LG receiving the clock signal CLK from the terminal BCK (FIG. 1).

This control logic LG is notably aimed at the generation of test signals which will be delivered on the various output terminals of the microcontroller CTLR connected to the impedance matching circuit MTC via a transmission "driver" circuit DTX.

These test signals, that will be detailed in more detail hereinafter, will give rise to the receipt of corresponding signals on some of the terminals of the microcontroller CTLR and will allow the determination of certain levels of physical quantities by a receiving circuit ARX.

These circuits DTX and ARX have a conventional structure known per se.

Furthermore, the first circuit FM1 here also comprises an LDO (Low Drop Out) voltage regulator receiving a power supply voltage from the power supply ALM and delivering a regulated voltage VDDRF to the driver circuit DTX.

As illustrated very diagrammatically in FIG. 3, the deliveries of test signals by the contactless component CTLR comprise deliveries in differential modes and/or in single-ended input/output mode.

More precisely, in a differential mode, two test signals in phase opposition STST10 and STST11 are respectively delivered on the output terminals RFO1 and RFO2 and this results in the reception on the two input terminals RFI1 and RFI2 of two corresponding received signals STSTR10 and STSTR11.

In a delivery in single-ended input/output mode, a test signal STST2 may be delivered on the output terminal RFO1 and a corresponding received signal STSTR2 may be received on the corresponding input terminal RFI1.

In another single-ended input/output delivery, a test signal STST3 may be delivered on the output terminal RFO2 and the corresponding signal STSTR3 received on the input terminal RFI2.

Figure 4:
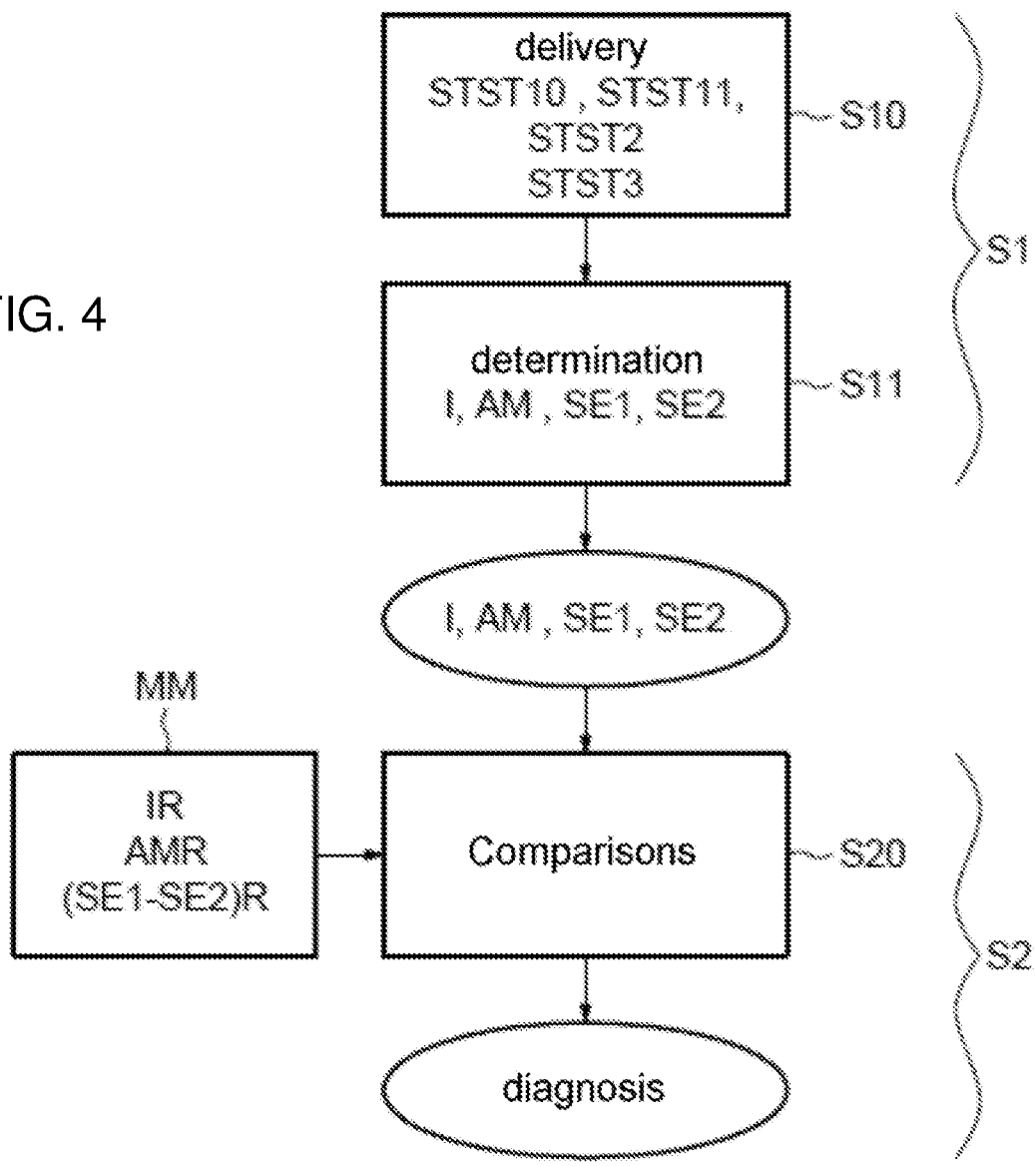
FIG. 4 is a flow diagram for the process of carrying out the first part of the detection of potential faults.

As illustrated in FIG. 4, this first part S1 of the detection of a potential fault therefore comprises:
  the delivery in the step S10 of the test signals STST10, STST11, STST2 and STST3 then,
  in the step S11, the determination from the corresponding received signals of:
    the differential level I of the current flowing in the impedance matching circuit,
    the differential amplitude AM of the two received differential signals corresponding to the two test signals transmitted in differential mode,
    together with amplitudes SE1 and SE2 of the received test signals STSTR2 and STSTR3 respectively corresponding to the two test signals STST2 and STST3 transmitted in single-ended input/output mode.

Then, in a second part S2 of the detection method, an analysis circuit MAL accommodated here in the microprocessor PROC (FIG. 1) analyzes the levels I, AM, SE1, SE2 of the corresponding physical quantities with respect to reference levels IR, AMR, (SE1−SE2)R by notably carrying out comparisons S20 so as to establish a diagnosis.

These reference levels IR, AMR, (SE1−SE2)R are stored in a memory MM.

By way of non-limiting example, the test signals STST10, STST11, STST2 and STST3 are pulses of the order of 100 to 200 microseconds of a carrier signal, for example at 13.56 MHz, having an amplitude of 2.5 volts.

The differential level I of the current flowing in the impedance matching circuit may, for example, be measured very simply by the measurement of the current delivered by the regulator LDO.

As regards the differential amplitudes AM and the amplitudes SE1 and SE2, they are determined in the receiver circuit ARX in a conventional manner.

However, the circuit ARX also allows a phase calculation.

It would accordingly be possible to use phases in place of the differential amplitudes AM and in place of the amplitudes SE1 and SE2.

For this purpose, whether in a differential mode or in a single-ended input/output mode, the phase of a received signal is the phase difference of this received signal with respect to the corresponding transmitted signal.

It would also be possible to use both differential amplitudes AM and phases and both amplitudes SE1 and SE2 and phases.

Figure 5:
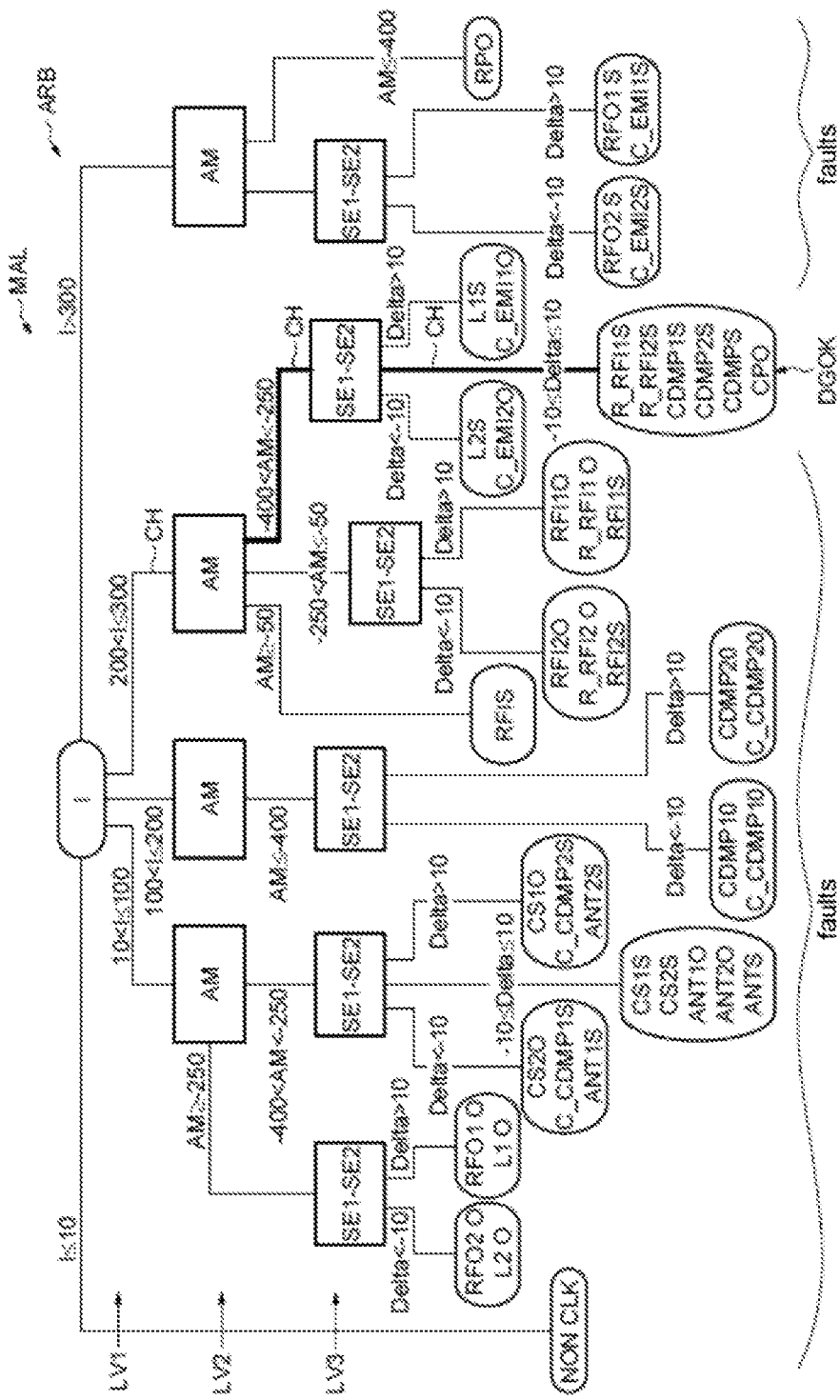
FIG. 5 illustrates a decision tree for the process for carrying out a second part of the detection of potential faults.

As illustrated in FIG. 5, in order to carry out the second part S2 of the detection, the analysis circuit, implemented, for example, by software within the microprocessor, implements a decision tree ARB having several decision levels, here three decision levels LV1, LV2 and LV3.

At each level, the analysis circuit carries out comparisons of the various levels of physical quantities obtained in the first part of the detection, with the reference levels IR, AMR, and (SE1−SE2)R.

More precisely, at the first level LV1 of the tree ARB, the differential level of current is compared with four reference differential levels respectively equal to 10, 100, 200 and 300 milliamps.

At the level LV2 of the tree ARB, the analysis circuit MAL compares the differential amplitude AM with three reference differential amplitudes respectively equal to −50, −250 and −400.

It should be noted here that these reference amplitudes correspond to digital levels at the output of analog-to-digital converters used for the measurement of these amplitudes and whose maximum level corresponds for example to −500.

The median value of the output scale of the converter corresponds, for example, to 2 volts.

At the level LV3 of the tree ARB, the analysis circuit first of all generates the difference Delta=SE1−SE2 and compares this difference Delta with two reference amplitudes respectively equal to −10 and +10.

Here again, these reference amplitudes correspond to differences in output levels of the analog-to-digital converter.

At the end of the latter comparison level, various output states are obtained which correspond either to detected faults or, in the present case, to a state DGOK considered as a state without a detectable fault detected at the output of the tree ARB.

More precisely, the letter "O" following the reference of a component or of a terminal corresponds to a fault of the open-circuit type in this component or this terminal.

The letter "S" following the reference of this component or of this terminal corresponds to a fault of the short-circuit type in this component or this terminal. For a component, a short-circuit connects its 2 terminals together. For a terminal, a short-circuit connects it with the ground of the circuit.

More precisely, at the level LV1, if the differential level I is less than or equal to 10 milliamps, then this means that there is an absence of the signal CLK, in other words probably a fault in the terminal BCK of the microcontroller CTLR configured to receive this clock signal CLK.

If the differential level I is higher than 10 milliamps, then it goes to level LV2, to comparisons of the differential amplitude AM with reference differential amplitudes.

Subsequently, depending on the result of these comparisons, various comparisons are carried out of the difference Delta with the reference amplitudes −10 and +10.

Thus, if the differential level I is greater than 10 and less than or equal to 100, and if the differential amplitude AM is higher than or equal to −250 and if the difference Δ is less than −10, then this leads to the conclusion that there is a fault of the open-circuit type in the output terminal RFO2 and/or in the coil L2.

If, on the other hand, during the latter comparison, the difference Delta is greater than 10, then it may be concluded that there is a fault of the open-circuit type in the output terminal RFO1 and/or in the coil L1.

Still in the scenario where the differential level I is higher than 10 and less than or equal to 100, and in the scenario where the differential amplitude AM is in the range between −400 and −250, then a difference Delta less than or equal to 10 and greater than or equal to −10 characterizes a fault of the short-circuit type within the capacitors CS1 and/or CS2 and/or a fault of the open-circuit type at the coupling points ANT1 and/or ANT2 and/or a fault of the short-circuit type at or in the antenna ANT itself.

For the sake of simplification of the description, the other paths of the tree ARB leading to the detection of potential faults will not be described in more detail, FIG. 5 being explicit in itself for this purpose.

On the other hand, it can be seen that the tree ARB comprises a path CH ending up at the state DGOK.

This path CH is followed when the differential level of current I is higher than 200 and less than or equal to 300 milliamps, when the differential amplitude AM is in the range between −400 and −250 and when the difference Delta is less than or equal to 10 and higher than or equal to −10.

The state DGOK is representative of the absence of any fault detected in the majority of the components and of the terminals of the NFC microcontroller-impedance matching circuit system and is also representative of potential, but undetectable, faults of the short-circuit type at or in the resistors R_RFI1, R_RFI2, at or in the auxiliary terminals CDMP1 and CDMP2, between these two terminals (such a short-circuit between the two terminals CDMP1 and CDMP2 being referenced CDMP S), and also including a fault of the open-circuit type at or in the capacitor CP.

Although it is possible to halt the analysis at the output of the tree ARB, because the majority of the potential faults have been detected, it is possible, if desired, to continue with the analysis once the state DGOK has been reached.

Figure 6:
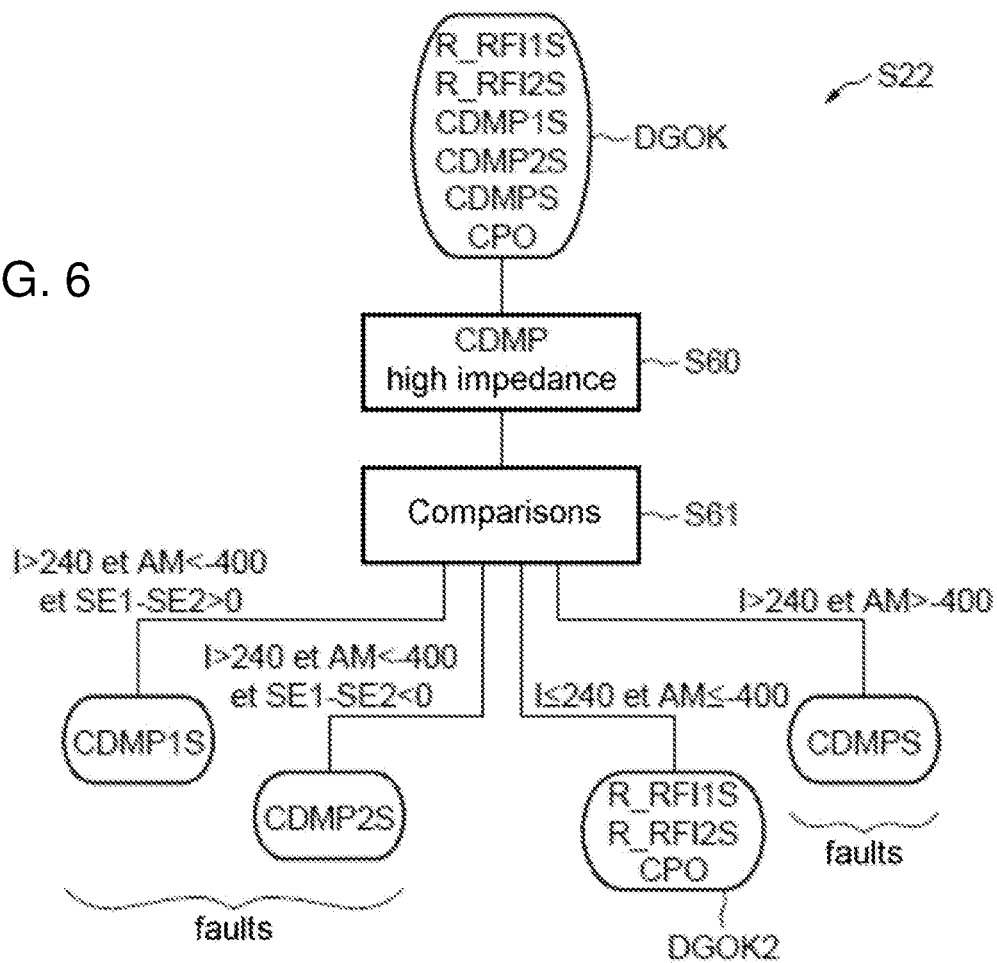
FIG. 6 illustrates details for an analysis for fault detection.

In this case, as illustrated in FIG. 6, the analysis comprises a second step S22 in which the two terminals CDMP are placed in high impedance mode (step S60) and the first part of the detection is re-executed, in other words the test signals which have previously been used are again delivered.

The levels I, AM, SE1 and SE2 are then re-measured.

The analysis circuit then proceeds, in the step S61, to a series of comparisons, as illustrated in FIG. 6. These comparisons are aimed at comparing the measured levels I, AM, SE1 and SE2 with additional reference levels, also stored in the memory MM.

More precisely, if the differential level I is higher than 240 milliamps, and if the differential amplitude AM is less than −400 and if the difference SE1−SE2 is positive, then this is representative of a short-circuit fault at or in the additional terminal CDMP1.

If the differential level is higher than 240 milliamps, the differential amplitude lower than −400 and the difference SE1−SE2 is negative, then there is a fault of short-circuit at or in the terminal CDMP2.

If the level I is higher than 240 milliamps and the differential amplitude higher than −400, then there is a fault of the short-circuit type CDMP S between the two additional terminals CDMP1 and CDMP2.

If, on the other hand, the level I is lower than or equal to 240 milliamps and the differential amplitude AM is less than or equal to −400, then this corresponds to a state DGOK2 representative of the absence of any detected fault with the proviso that a fault of the short-circuit type at or within the resistors R_RFI1 and R_RFI2 is not detectable just like a fault of the open-circuit type at or in the capacitor CP.

In this case, and if the system is still defective, then other investigations using other conventional means may be undertaken with regard to these resistors and this capacitor CP.

Figure 7:
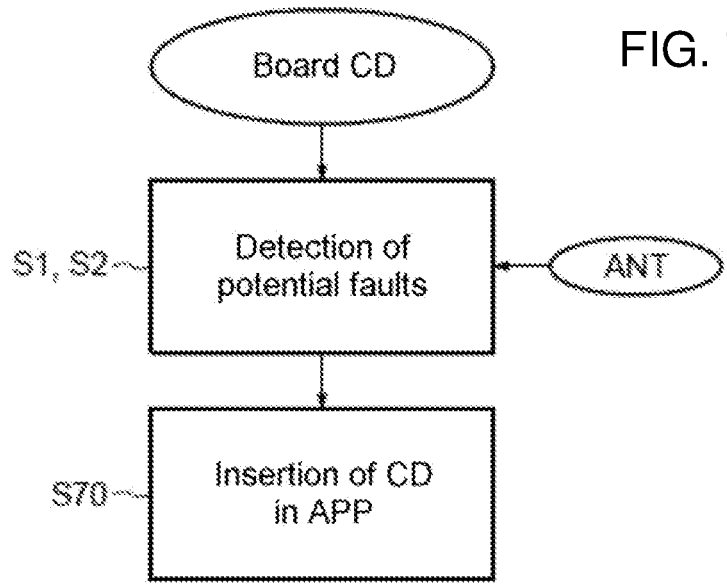
FIG. 7 illustrates a procedure for carrying out the detection of the potential faults.

As indicated hereinbefore and as illustrated in FIG. 7, it is possible to carry out the detection of the potential faults (parts S1 and S2) by coupling the board CD to an antenna emulating the future antenna, before inserting the board CD into the apparatus APP (step S70).

Figure 8:
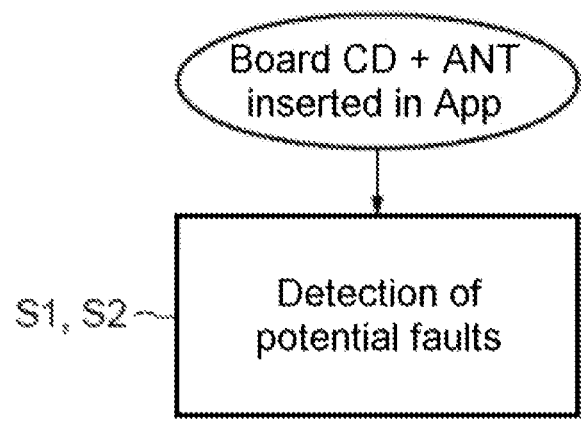
FIG. 8 illustrates another procedure for carrying out the detection of the potential faults.

As a variant, as illustrated in FIG. 8, it is possible to carry out the detection of the potential faults (parts S1 and S2) when the board CD is inserted into the apparatus APP and coupled to the antenna, for example for a customer return when a fault has been observed.

Figure 9:
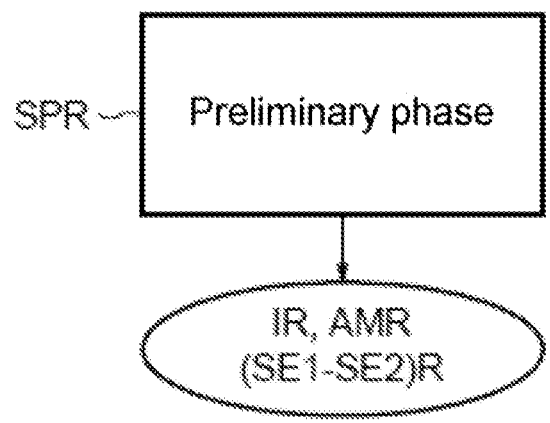
FIG. 9 illustrates a further procedure for carrying out the detection of the potential faults.

As illustrated diagrammatically in FIG. 9, the various reference levels IR, AMR, (SE1–SE2)R and/or the various additional reference levels may for example have been generated during a preliminary part SPR.

This preliminary part SPR uses the same values of test signals as those used in the first part S1 of the detection. It may, for example, comprise simulations and/or intentional creations of faults in the impedance matching circuit. This preliminary part may also be carried out on several boards equipped with impedance matching circuits in order to take into account potential variations in the methods of fabrication, and to subsequently apply averages of the various reference levels obtained from these various boards.

The invention claimed is:

1. A method for on-board detection of potential faults in a system that is mounted onto a board, wherein the system comprises an impedance matching circuit coupled to a contactless communications component, the method comprising:
    having the contactless communications component itself perform a first detection process part by applying test signals to the impedance matching circuit which generate test results, wherein the first detection process part comprises:
        first delivering two first test signals in phase opposition to two output terminals of the contactless communications component connected to the impedance matching circuit;
        receiving two corresponding first receive signals from two input terminals of the contactless communications component connected to the impedance matching circuit;
        second delivering a second test signal to one of the output terminals;
        receiving a corresponding second receive signal from one of the input terminals;
        third delivering a third test signal to another one of the output terminals; and
        receiving a corresponding third receive signal from another one of the input terminals; and
    performing a second detection process part by analyzing results obtained from the first detection process part in order to diagnose the potential faults, wherein the second detection process part comprises identifying physical quantities by:
        determining a differential level of current flowing in the impedance matching circuit, together with a differential amplitude of the two corresponding first receive signals and/or a phase of one of the two corresponding first receive signals;
        determining an amplitude and/or phase of the corresponding second receive signal; and
        determining an amplitude and/or phase of the corresponding third receive signal;
    wherein the analyzing comprises executing a software application implementing at least one decision tree to analyze levels of said physical quantities with respect to reference levels.

2. The method according to claim 1, wherein the potential faults belong to a group comprising potential faults in components of the impedance matching circuit, potential faults in connection of components to the board, and potential faults in connections of the contactless component to the board.

3. The method according to claim 2, wherein, during performing the first detection process part, the impedance matching circuit is coupled to an antenna.

4. The method according to claim 3, wherein the potential faults in the group further comprise potential faults at coupling points of the board with the antenna.

5. The method according to claim 2, wherein the potential faults comprise a fault of one of a short-circuit type or an open-circuit type.

6. The method according to claim 1, wherein the second detection process part is carried out within the contactless communications component.

7. The method according to claim 1, wherein the second detection process part is carried out by a processing unit, wherein the processing unit is also fixed onto the board but is distinct from the contactless communications component.

8. The method according to claim 1, wherein the second detection process part is carried out by a processing unit, wherein the processing unit is in communication with, but not mounted on, the board.

9. The method according to claim 1, wherein the at least one decision tree comprises three decision levels comprising:
    at a first decision level, first comparing the differential level of current to at least one reference differential level, then
    at a second decision level, second comparing the differential amplitude and/or phase to a reference differential amplitude and/or a reference phase, respectively, then
    at a third decision level, determining a difference between the amplitude and/or phase of the corresponding second received signal and the amplitude and/or phase of the corresponding third received signal and third comparing the difference of amplitude and/or phase to a reference difference amplitude and/or phase.

10. The method according to claim 9, wherein the contactless component comprises two additional output terminals connected to one or more damping resistors and further comprising testing to detect potential faults of a short-circuit type on the two additional output terminals.

11. The method according to claim 10, wherein testing comprises:
    re-executing the first detection process part after having configured the two additional output terminals in high impedance mode, and
    performing in the second detection process part additional comparisons respectively of the differential level of current, the differential amplitude and/or phase, and the difference of amplitude and/or phase to at least one additional reference differential level, at least one additional reference differential amplitude and/or at least one additional reference phase, and at least one reference difference of amplitude and/or phase.

12. The method according to claim 9, comprising generating reference levels and/or additional reference levels.

13. The method according to claim 1, wherein the contactless communications component is a controller compatible with near-field communications technology.

14. The method according to claim 1, wherein the method is implemented prior to inserting the board into an apparatus designed to support a contactless communications function.

15. The method according to claim 1, wherein the method is implemented within an apparatus designed to support a contactless communications function and equipped with the board.

* * * * *